(12) United States Patent  
Saha et al.

(10) Patent No.: US 7,936,170 B2
(45) Date of Patent: May 3, 2011

(54) RF COIL AND APPARATUS TO REDUCE ACOUSTIC NOISE IN AN MRI SYSTEM

(75) Inventors: Saikat Saha, Florence, SC (US); Eddy B. Boskamp, Menomonee Falls, WI (US)

(73) Assignee: General Electric Co., Schenectady, NY (US)

( * ) Notice: Subject to any disclaimer, the term of this patent is extended or adjusted under 35 U.S.C. 154(b) by 311 days.

(21) Appl. No.: 12/188,266

(22) Filed: Aug. 8, 2008

(65) Prior Publication Data

US 2010/0033185 A1 Feb. 11, 2010

(51) Int. Cl.
*G01V 3/00* (2006.01)
(52) U.S. Cl. ........................ 324/318; 324/322
(58) Field of Classification Search .......... 324/300–322; 600/407–445
See application file for complete search history.

(56) References Cited

U.S. PATENT DOCUMENTS

| | | | | |
|---|---|---|---|---|
| 6,040,697 A * | 3/2000 | Misic | ............... | 324/318 |
| 6,252,404 B1 | 6/2001 | Purgill et al. | | |
| 6,404,201 B1 * | 6/2002 | Boskamp | ............. | 324/318 |
| 6,437,568 B1 | 8/2002 | Edelstein et al. | | |
| 6,538,441 B1 | 3/2003 | Watkins et al. | | |
| 7,102,350 B2 * | 9/2006 | Weyers et al. | .......... | 324/318 |
| 7,443,163 B2 * | 10/2008 | Warntjes et al. | .......... | 324/318 |
| 7,633,294 B2 * | 12/2009 | Leussler et al. | .......... | 324/318 |
| 7,639,012 B2 * | 12/2009 | Habara et al. | .......... | 324/318 |
| 7,671,593 B2 * | 3/2010 | Goldhaber et al. | ....... | 324/318 |
| 7,683,623 B2 * | 3/2010 | Zhai et al. | .......... | 324/318 |
| 2007/0290686 A1 | 12/2007 | Goldhaber et al. | | |

* cited by examiner

*Primary Examiner* — Brij B Shrivastav (57) ABSTRACT

A radio frequency (RF) coil for a magnetic resonance imaging (MRI) system includes a first end ring section containing a plurality of openings and a second end ring section containing a plurality of openings. A plurality of rungs is disposed between the first end ring section and the second end ring section. Each rung has a first end connected to the first end ring section and a second end connected to the second end ring section. Each rung can also include a plurality of openings. The openings in the end rings and rungs reduces eddy currents and improves RF performance of the RF coil.

18 Claims, 7 Drawing Sheets

RF COIL AND APPARATUS TO REDUCE ACOUSTIC NOISE IN AN MRI SYSTEM

FIELD OF THE INVENTION

The present invention relates generally to a magnetic resonance imaging (MRI) system and in particular to a radio frequency (RF) coil and apparatus to reduce acoustic noise in an MRI system.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

During an MRI scan, acoustic noise and vibration can be generated in the patient bore. The acoustic noise and vibration can be uncomfortable and potentially harmful to both the patient and the scanner operator. There are several sources of acoustic noise in an MRI system including, for example, the gradient coils and the RF body coil. The acoustic noise generated by the RF coil is typically caused by eddy currents induced in the RF coil conductors by the operation of the gradient coils. In particular, current pulses are applied (e.g., as part of a pulse sequence) to the gradient coils to generate time-varying magnetic fields. These time-varying magnetic fields can induce eddy currents in the RF coil that cause motion or vibration of the RF coil and results in acoustic noise. It would be desirable to provide an RF coil and apparatus that reduces or eliminates acoustic noise generated by the RF coil.

BRIEF DESCRIPTION OF THE INVENTION

In accordance with an embodiment, a radio frequency (RF) coil for a magnetic resonance imaging (MRI) system includes a first end ring section, a second end ring section, a plurality of rungs disposed between the first end ring section and the second end ring section, each rung comprising a first end connected to the first end ring section and a second end connected to the second end ring section, a first plurality of openings located in the first end ring section and a second plurality of openings located in the second end ring section.

In accordance with another embodiment, a radio frequency (RF) coil for a magnetic resonance imaging (MRI) system includes a first end ring section, a second end ring section and a plurality of rungs disposed between the first end ring section and the second end ring section, where each rung includes a first end connected to the first end ring section, a second end connected to the second end ring section, a first opening located at the first end of the rung, a second opening located at the second end of the rung, a slit having a width, a first end connected to the first opening and a second end connected to the second opening and a capacitor coupled across the width of the slit.

In accordance with another embodiment, a resonance assembly for a magnetic resonance imaging (MRI) assembly includes a superconducting magnet, a gradient coil assembly disposed within an inner diameter of the superconducting magnet and an RF coil disposed within an inner diameter of the gradient coil assembly and comprising a first end ring section having a plurality of openings, a second end ring section having a plurality of openings and a plurality of rungs disposed between the first end ring section and the second end ring section.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
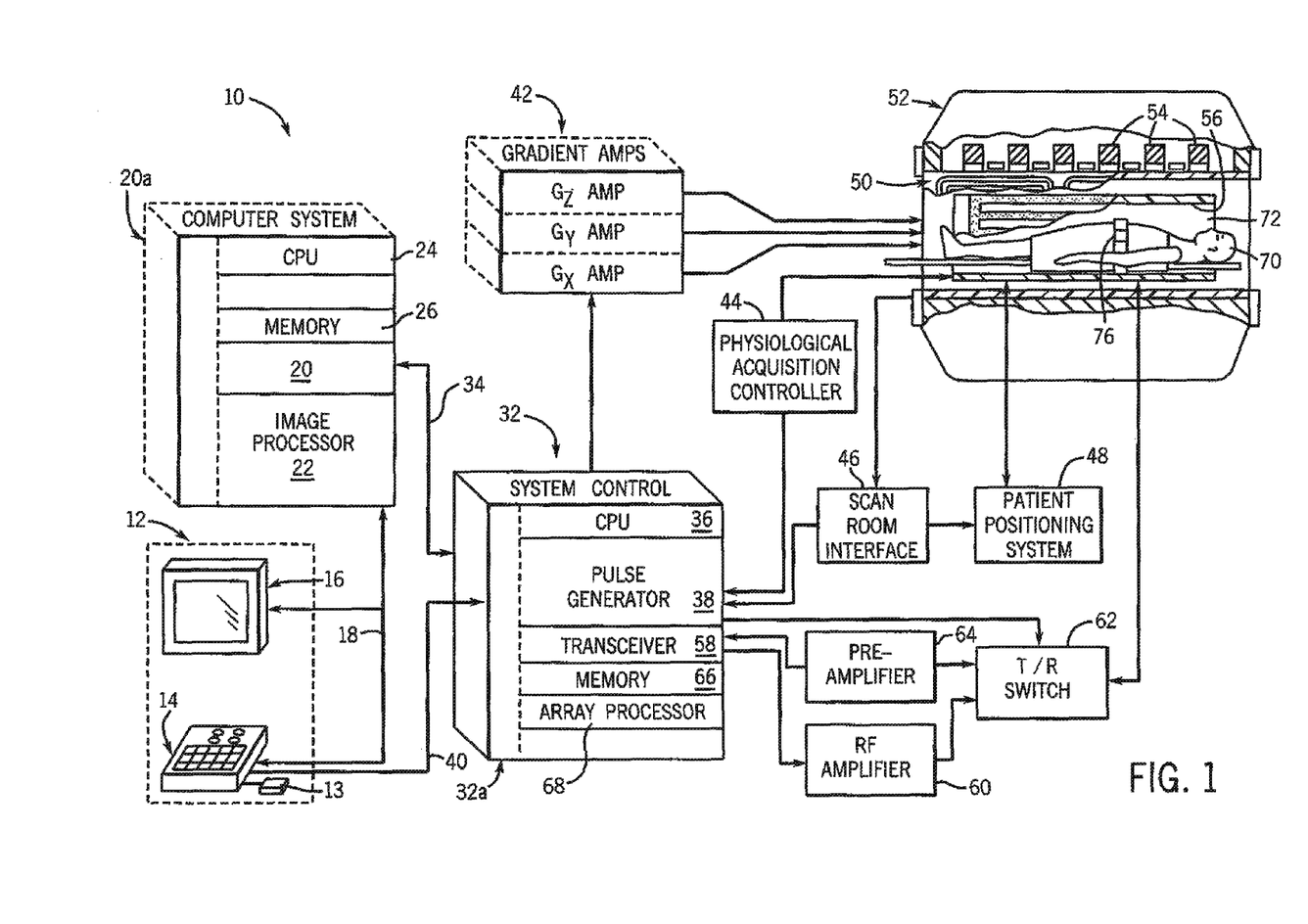
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a back-plane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
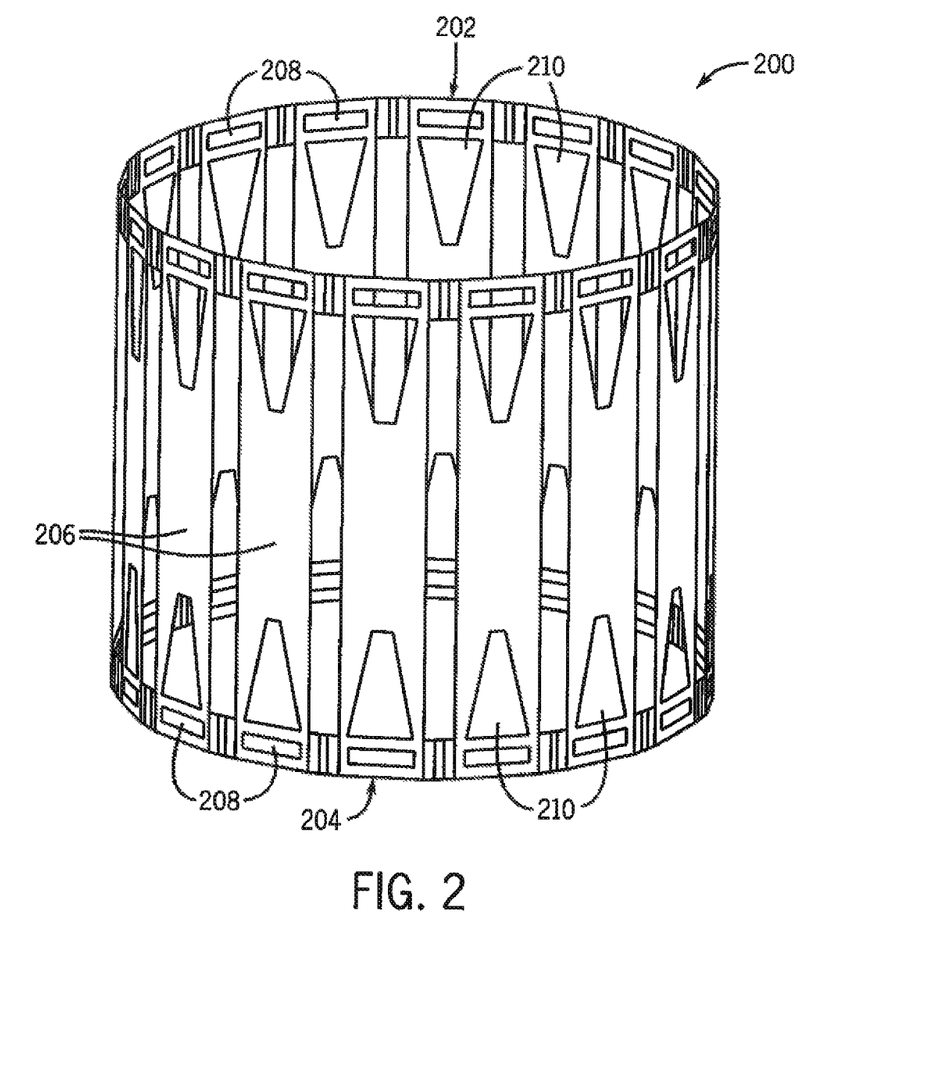
FIG. 2 is a diagram of a perspective view of a radio frequency (RF) coil in accordance with an embodiment.

As mentioned, a whole body RF coil 56 is used to transmit RF pulses and/or to receive MR signals. RF coil 56 may be configured to reduce acoustic vibration and noise generated by the RF coil and thereby improve patient comfort. FIG. 2 is a diagram of a perspective view of a radio frequency (RF) coil in accordance with an embodiment. RF coil 200 is cylindrical and annular in shape and is compatible with the above-described MRI system of FIG. 1 or any other similar or equivalent system for obtaining MR images. The dimensions of RF coil 200 are configured so that the RF coil can be mounted inside a gradient coil assembly 50 (shown in FIG. 1) in a spaced apart coaxial relationship. The RF coil 200 shown in FIG. 2 is a birdcage configuration and includes a first end ring section 202, a second end ring section 204 and a plurality of rungs (or legs, conductor elements) 206. The first end ring section 202 and the second end ring section 204 oppose one another in a spaced-apart relationship and are connected by the plurality of rungs 206. An exemplary number of rungs 206 are shown in FIG. 2. Fewer or more rungs may be used based on the requirements of a particular imaging application, for example, based on the field of view (FOV), image resolution, power requirements and imaging speed. The rungs 206 are arranged cylindrically and can be, for example, uniformly spaced from one another. RF coil 200 also includes a plurality of capacitors (for example, low inductance end ring capacitors) at each end of the rungs 206 along the respective end ring section 202, 204 that electrically connect the rungs. Rungs 206 and end ring sections 202, 204 are constructed from conventional materials with high electrical conductivity such as copper.

Figure 3:
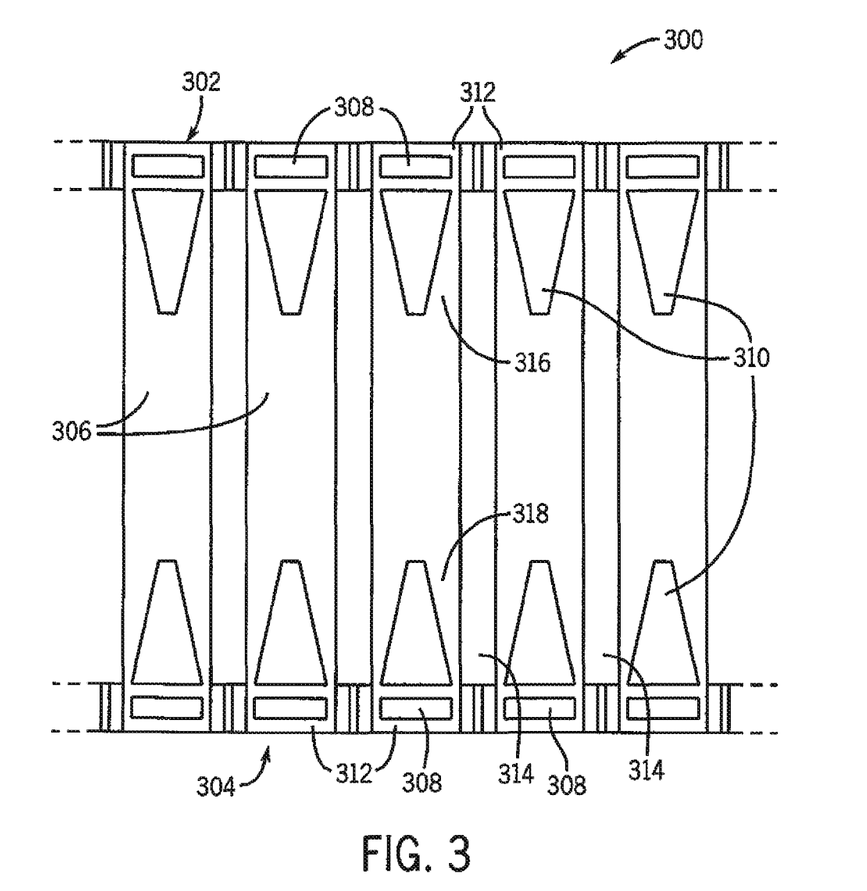
FIG. 3 is a diagram of a section of an RF coil in accordance with an embodiment.

Each rung 206 and end ring section 202, 204 includes openings or cutouts, for example, end ring openings 208 and rung openings 210. The openings 208, 210 reduce or minimize eddy currents (and thereby acoustic vibrations and noise) and maximize RF performance of the coil 200. FIG. 3 is a diagram of a section of an RF coil in accordance with an embodiment. For purposes of illustration, a section of RF coil 300 is shown in FIG. 3 as a representation of a plane view of an outstretched coil. The rungs 306 in RF coil 300 are spaced apart from one another by gaps 314. The end ring openings 308 in the first end ring section 302 and the end ring openings 308 in the second end ring section 304 are located at regions (or areas) 312 where the rungs 306 meet the end ring sections 302, 304. In the embodiment shown in FIG. 3, each rung 306 has a rung opening 310 at a first end 316 and a rung opening 310 at a second end 318. The end ring openings 308 and the rung openings 310 are formed by removing material (e.g., copper) from the end ring section or rung, respectively. The rung openings 310 preferably have a tapered rectangular shape as shown in FIGS. 2 and 3 where the opening is wider at an end nearer the end ring and narrower at an end nearer the center of the rung. Such a shape maximizes RF performance and minimizes the effects of gradient induced eddy currents. Alternatively, other shapes may be used for the rung openings 310. In FIGS. 2 and 3, the end ring openings 308 are shown with a rectangular shape. In other embodiments, the end ring openings may have different shapes, for example, a U-shape as discussed below with respect to FIGS. 4-7.

Figure 4:
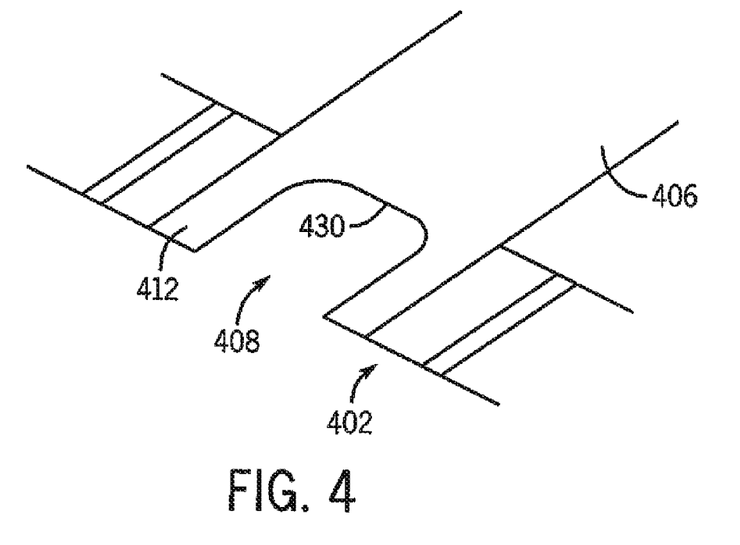
FIG. 4 is a diagram of a perspective view of a portion of an RF coil rung and end ring section in accordance with an alternative embodiment.
Figure 5:
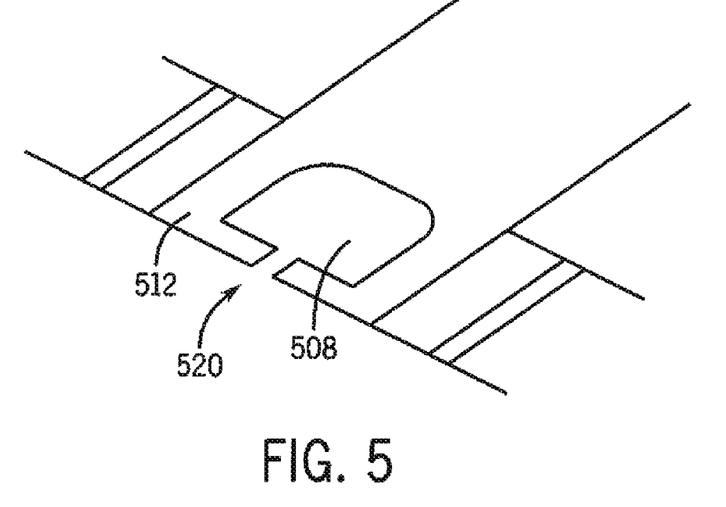
FIG. 5 is a diagram of a perspective view of a portion of an RF coil rung and end ring section in accordance with an embodiment.
Figure 6:
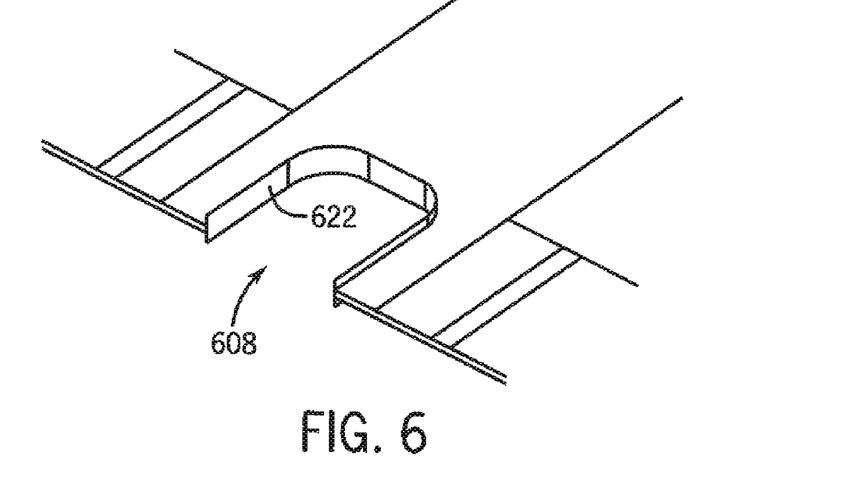
FIGS. 6 and 7 are diagrams of perspective views of an RF coil rung and end ring section in accordance with an alternative embodiment.
Figure 7:
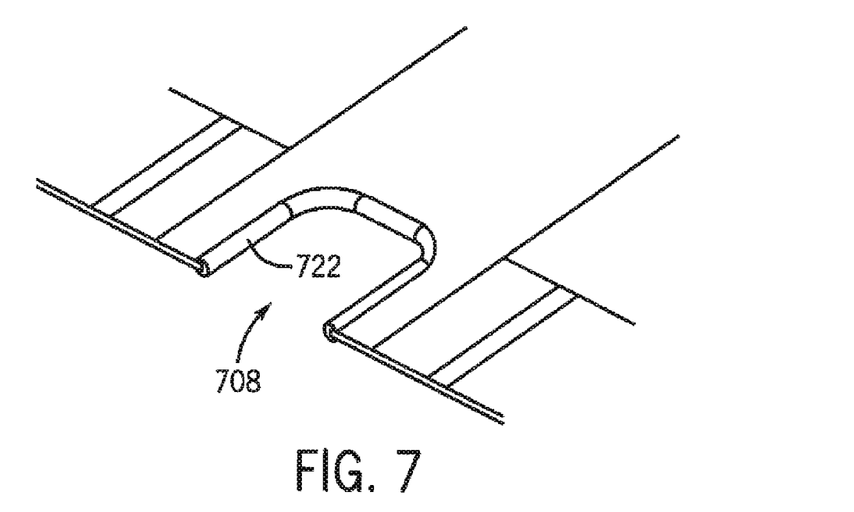

FIG. 4 is a diagram of a perspective view of a portion of an RF coil rung and end ring section in accordance with an embodiment. A portion of one end of a rung 406 and an end ring section 402 are shown in FIG. 4. End ring opening 408 has a U-shape and is located in a region 412 where rung 406 meets the end ring section 402. End ring opening 408 creates a high impedance for eddy currents in the region 412. In one embodiment, end ring opening 408 may be filled with a hatched or meshed copper (not shown) to spread out the current density created by the end ring opening 408. In an alternative embodiment, shown in FIG. 5, a capacitor 520 (e.g., a capacitor greater than 1 nF) may be placed across the end ring opening 508 in the region 512. Returning to FIG. 4, the current density may also be spread out by lowering the reactance/resistance on an inside edge 430 of the end ring opening 408 as shown in FIGS. 6 and 7. In FIGS. 6 and 7, copper 622, 722 is added to the inside edge of the end ring opening 608, 708.

Figure 8:
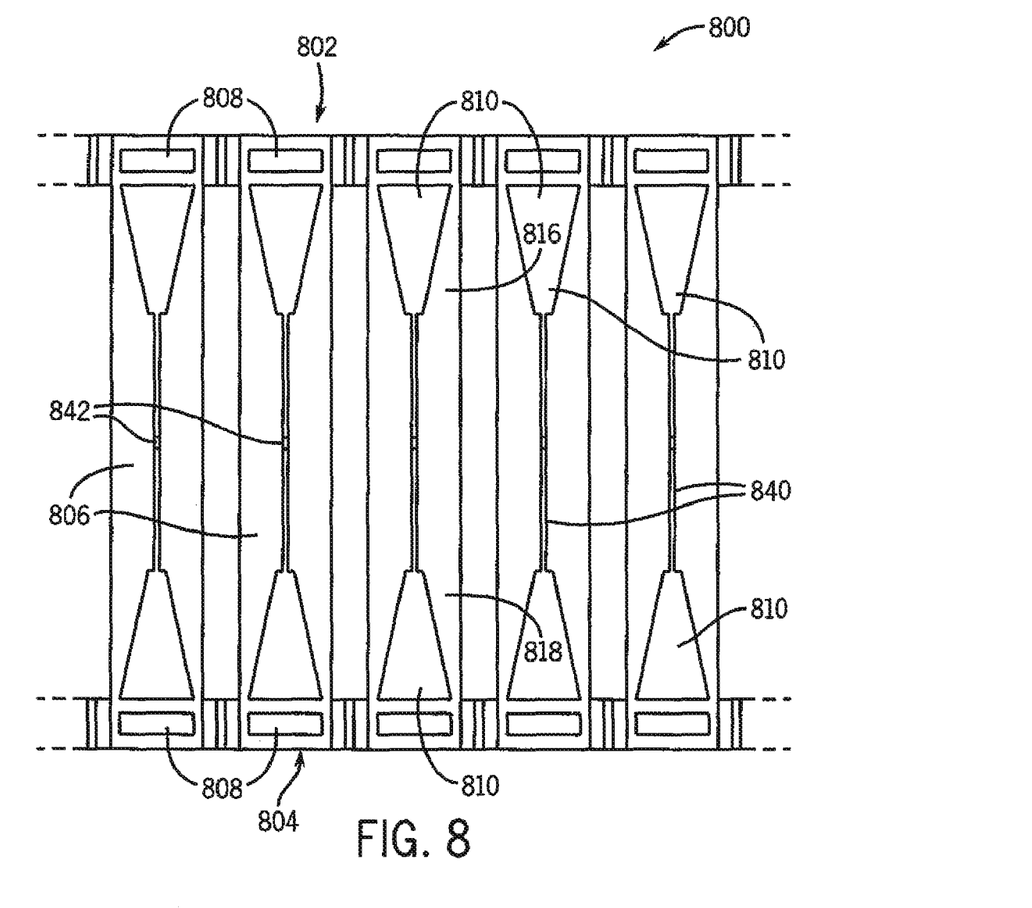
FIG. 8 is a diagram of a section of an RF coil in accordance with an embodiment.

Returning to FIG. 3, as mentioned, the end ring openings 308 and rung openings 310 reduce or minimize eddy currents and maximize the RF performance of the coil 300. To further reduce eddy currents, each rung may also include a slit or slot as shown in FIG. 8. FIG. 8 is a diagram of a section of an RF coil in accordance with an embodiment. For purposes of illustration, a section of an RF coil 800 is shown in FIG. 8 as a representation of a plane view of an outstretched coil. The RF coil 800 shown in FIG. 8 is a birdcage configuration and is compatible with the above-described MRI system of FIG. 1 or any other similar or equivalent system for obtaining MR images. RF coil 800 includes a first end ring section 802, a second end ring section 804 and a plurality of rungs (or legs, conductive elements) 806. Each rung 806 and end ring section 802, 804 includes openings or cutouts, for example, end ring openings 808 and rung openings 810. In addition, each rung 806 also includes a slit or slot 840 to further reduce eddy currents. The slit 840 is connected between a rung opening 810 at a first end 816 of a rung 806 and a rung opening 810 at a second end 818 of a rung 806. To prevent mode mixing and degraded RF performance that may be caused or introduced by the use of slit 840, a capacitor 842 is placed across each slit 840. The capacitor 842 acts as high impedance for eddy currents but acts as a short at RF frequency.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. A radio frequency (RF) coil for a magnetic resonance imaging (MRI) system, the RF coil comprising:
   a first end ring section;
   a second end ring section;
   a plurality of rungs disposed between the first end ring section and the second end ring section, each rung comprising a first end connected to the first end ring section and a second end connected to the second end ring section;
   a first plurality of openings located in the first end ring section; and
   a second plurality of openings located in the second end ring section.

2. An RF coil according to claim 1, wherein each rung further comprises:
   a first opening located in proximity to the first end of the rung; and
   a second opening located in proximity to the second end of the rung.

3. An RF coil according to claim 2, wherein each rung further comprises:
   a slit having a width, a first end connected to the first opening and a second end connected to the second opening; and
   a capacitor coupled across the width of the slit.

4. An RF coil according to claim 1, wherein the first end ring section further comprises a plurality of capacitors.

5. An RF coil according to claim 1, wherein the second end ring section further comprises a plurality of capacitors.

6. An RF coil according to claim 1, wherein the plurality of rungs are constructed of a material with high electrical conductivity.

7. An RF coil according to claim 1, wherein each opening in the first plurality of openings has a rectangular shape.

8. An RF coil according to claim 1, wherein each opening in the second plurality of openings has a rectangular shape.

9. An RF coil according to claim 1, wherein each opening in the first plurality of openings has a U-shape.

10. An RF coil according to claim 1, wherein each opening in the second plurality of openings has a U-shape.

11. A radio frequency (RF) coil for a magnetic resonance imaging (MRI) system, the RF coil comprising:
    a first end ring section;
    a second end ring section; and
    a plurality of rungs disposed between the first end ring section and the second end ring section, each rung comprising:
       a first end connected to the first end ring section;
       a second end connected to the second end ring section;
       a first opening located at the first end of the rung;
       a second opening located at the second end of the rung;
       a slit having a width, a first end connected to the first opening and a second end connected to the second opening; and
       a capacitor coupled across the width of the slit.

12. An RF coil according to claim 11, further comprising:
a first plurality of openings located in the first end ring section; and
a second plurality of openings located in the second end ring.

13. An RF coil according to claim 12, wherein the first end ring section further comprises a plurality of capacitors.

14. An RF coil according to claim 12, wherein the second end ring section further comprises a plurality of capacitors.

15. A resonance assembly for a magnetic resonance imaging (MRI) assembly, the resonance assembly comprising:
a superconducting magnet;
a gradient coil assembly disposed within an inner diameter of the superconducting magnet; and
an RF coil disposed within an inner diameter of the gradient coil assembly and comprising a first end ring section having a plurality of openings, a second end ring section having a plurality of openings and a plurality of rungs disposed between the first end ring section and the second end ring section.

16. A resonance assembly according to claim 15, wherein each rung comprises a plurality of openings.

17. A resonance assembly according to claim 16, wherein each rung further comprises:
a slit having a width; and
a capacitor coupled across the width of the slit.

18. A resonance assembly according to claim 15, wherein the plurality of rungs are constructed of a material with high electrical conductivity.

* * * * *